United States Patent [19]
Ito

[11] Patent Number: 5,497,399
[45] Date of Patent: Mar. 5, 1996

[54] DIGITAL FM MODULATING APPARATUS

[75] Inventor: Kenichi Ito, Tokyo, Japan

[73] Assignee: NEC Corporation, Japan

[21] Appl. No.: 119,979

[22] Filed: Sep. 10, 1993

[30] Foreign Application Priority Data

Sep. 10, 1992 [JP] Japan .................... 4-241511

[51] Int. Cl.$^6$ .............. H03K 7/06; H03K 9/06
[52] U.S. Cl. ............ 375/271; 375/285; 375/296; 375/302; 455/43; 455/63; 455/76; 455/110; 332/126; 331/16; 331/175; 327/39; 327/58; 327/105
[58] Field of Search .............. 375/59, 60, 62, 375/67, 44, 57, 271, 284, 285, 295, 296, 302, 303, 308; 332/117, 118, 123, 124, 126, 127, 128; 455/63, 110–113, 206, 210, 208, 214, 42, 62; 327/105, 106, 107; 331/11, 14–16, 18, 23

[56] References Cited

U.S. PATENT DOCUMENTS

| | | | |
|---|---|---|---|
| 4,578,818 | 3/1986 | Claydon | 332/123 |
| 4,682,123 | 7/1987 | Loper et al. | 455/110 |
| 4,794,621 | 12/1988 | Dirr | 455/110 |
| 4,802,236 | 1/1989 | Walczak et al. | 455/110 |
| 5,027,087 | 6/1991 | Rottinghaus | 332/127 |
| 5,053,728 | 10/1991 | Bögl | 332/127 |
| 5,126,699 | 6/1992 | Kabler | 332/124 |
| 5,272,454 | 12/1993 | Ikai et al. | 332/117 |

FOREIGN PATENT DOCUMENTS 2234652  2/1991  United Kingdom.

OTHER PUBLICATIONS

Hamada, M., et al, "Design of a Digital FM Modulator for Satellite Broadcasting Earth Stations", 14th AIAA International Communication Satellite Systems Conference & Exhibit, Washington, D.C., Mar. 22–26, 1992, pp. 1702–1713.

Primary Examiner—Stephen Chin
Assistant Examiner—Amanda T. Le
Attorney, Agent, or Firm—Ostrolenk, Faber, Gerb & Soffen

[57] ABSTRACT

A digital FM modulating apparatus includes a device for restricting modulation data between a lower limit data value and an upper limit data value which respectively correspond to a minimum allowable frequency and a maximum allowable frequency value of an FM modulated signal. The apparatus also includes a device for suppressing transitional variance in the restricted modulating data and a direct digital synthesizer for receiving the suppressed data and producing synthesized data corresponding to the FM modulated signal.

6 Claims, 3 Drawing Sheets

T: ARITHMETIC TIMING PERIOD

T: ARITHMETIC TIMING PERIOD

DIGITAL FM MODULATING APPARATUS

BACKGROUND OF THE INVENTION

The present invention relates to a digital FM modulating apparatus and, more particularly, to a digital FM modulating apparatus used for transmitting digital data such as a television signal and an audio signal.

As shown in FIG. 1, a conventional digital FM modulating apparatus comprises an A/D converter 1, a multiplier 2 for multiplying a digital modulation signal by multiplication data designating the maximum deviation frequency, an adder 3 for adding the output of the multiplier 2 with addition data designating a center frequency and a direct digital synthesizer (DDS) 4. Further, the DDS 4 includes a reference oscillator 5 for generating sampling timings, an adder 6, a latch 7, a read-only memory (ROM) 8 for storing sine wave data and a D/A converter 9. In the DDS 4, the incoming data from the adder 3 are accumulated through the latch 7 at the sampling timings and the accumulated data from the latch 7 are applied to the ROM 8 as address data. Accordingly, FM modulated signal data are obtained from the ROM and, then, converted into analog FM modulated signal by the D/A converter 9.

However, a conventional digital FM modulating apparatus has the following drawbacks. When a digital data error or abnormal data occurs through data transmission to the ROM 8, the resultant modulated signal has an undesirable spread frequency spectrum beyond the regular range. Further, when an erroneous digital data transition occurs through data transmission, the frequency spectrum is also undesirably spread.

SUMMARY OF THE INVENTION

It is therefore an object of the present invention to provide a digital FM modulating apparatus capable of preventing an undesirable spread frequency spectrum even if a data error or abnormal data transition occurs through data transmission.

According to the present invention, there is provided a digital FM modulating apparatus comprising a circuit arrangement for restricting the modulation data into a data range between the minimum data and the maximum data, respectively, corresponding to the regular lower and upper frequencies of an FM modulated signal; a circuit arrangement for suppressing transitional variance in the restricted data; and a direct digital synthesizer receiving the suppressed data for producing synthesized data corresponding to the FM modulation signal.

DETAILED DESCRIPTION OF THE PREFERRED EMBODIMENT

Figure 1:
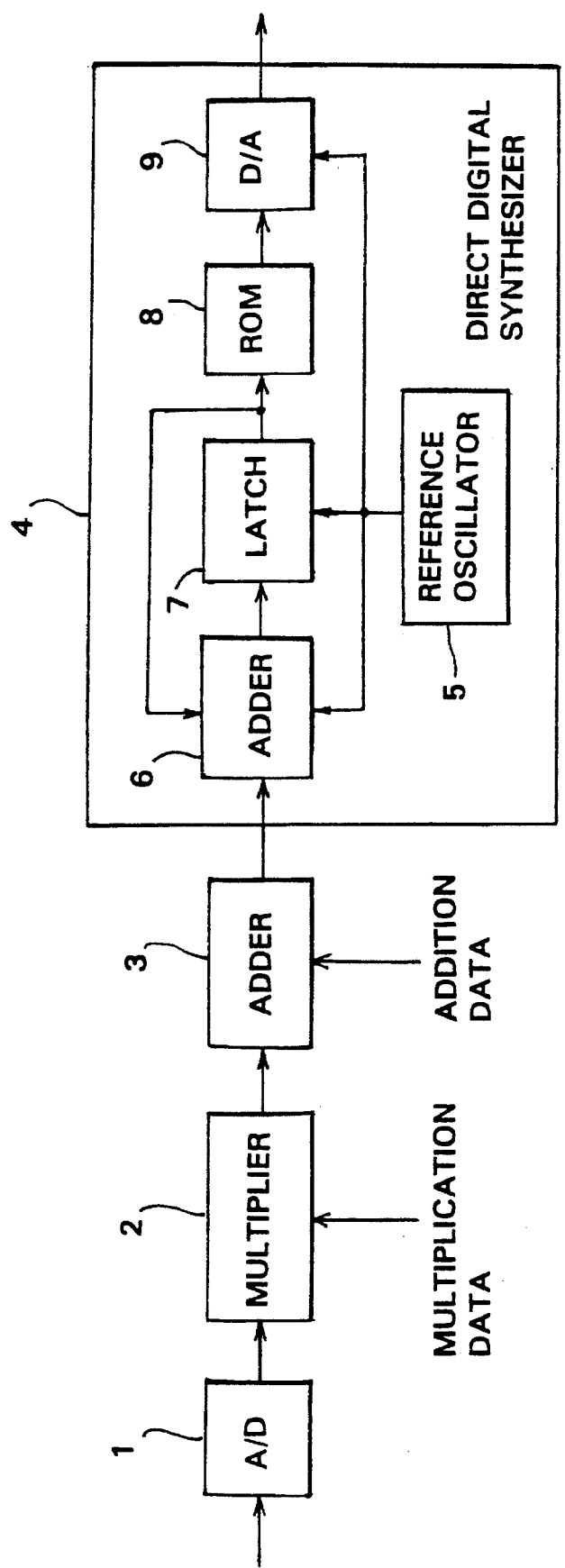
FIG. 1 is a block diagram showing a conventional digital FM modulating apparatus.
Figure 2:
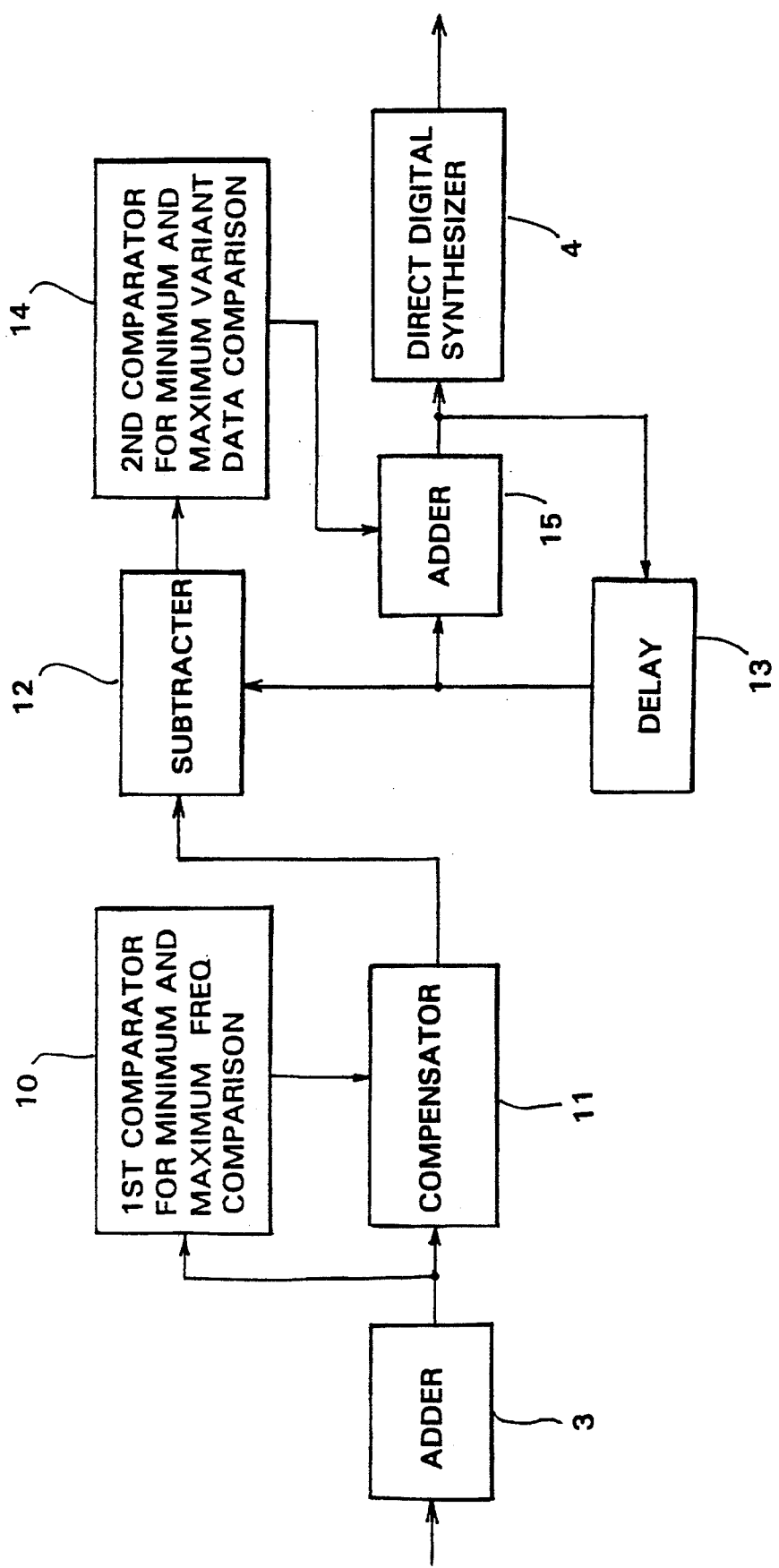
FIG. 2 is a block diagram showing an embodiment of the present invention.

Referring to FIG. 2, an additional arrangement of an embodiment is provided between the adder 3 and the direct digital synthesizer 4 shown in FIG. 1. In the additional arrangement, a first comparator 10 compares input data from the adder 3 with lower and upper limit data corresponding to the minimum frequency and the maximum frequency of a regular frequency range, respectively. A compensator 11 receives the input data and replaces the data with the lower limit data or the upper limit data if the input data becomes less than the lower limit data or more than the upper limit data. Otherwise, the compensator 11 passes the input data to a subtracter 12. By the combination of the first comparator 10 and the compensator 11, abnormal input data are converted into data having the normal range and thus, the frequency range of the resultant FM modulated signal is restricted in the regular frequency range.

The subtracter 12 produces variant data representing the difference between the compensated data from the compensator 11 and previous data delivered from a delay 13. The variant data from the subtracter 12 are supplied to a second comparator 14. The comparator 14 compares the input variant data with the allowed maximum variant data which is predetermined such that abnormal data transition never occurs in the data input to the DDS 4. Therefore, the comparator 14 outputs the input variant data if it is not more than the maximum variant data or supplies the maximum variant data if the input variant data is more than the maximum variant data. An adder 15 adds the output data delivered from the second comparator 14 and the previous data delivered from the delay 13 and supplies the added data to the DDS 4 as modulation data. The modulation data is also supplied to the delay 13.

Figure 3:
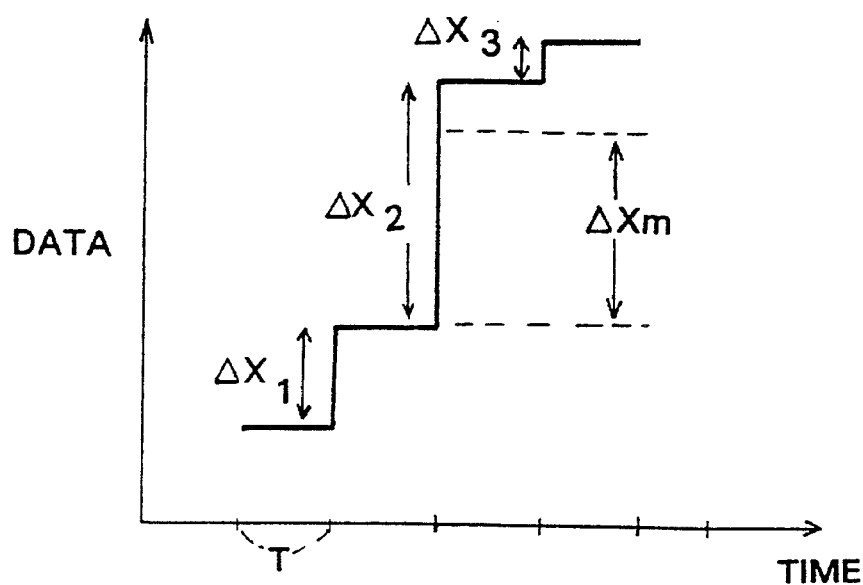
FIGS. 3(a) and 3(b) are diagrams showing operation of the present invention.
Figure 3:
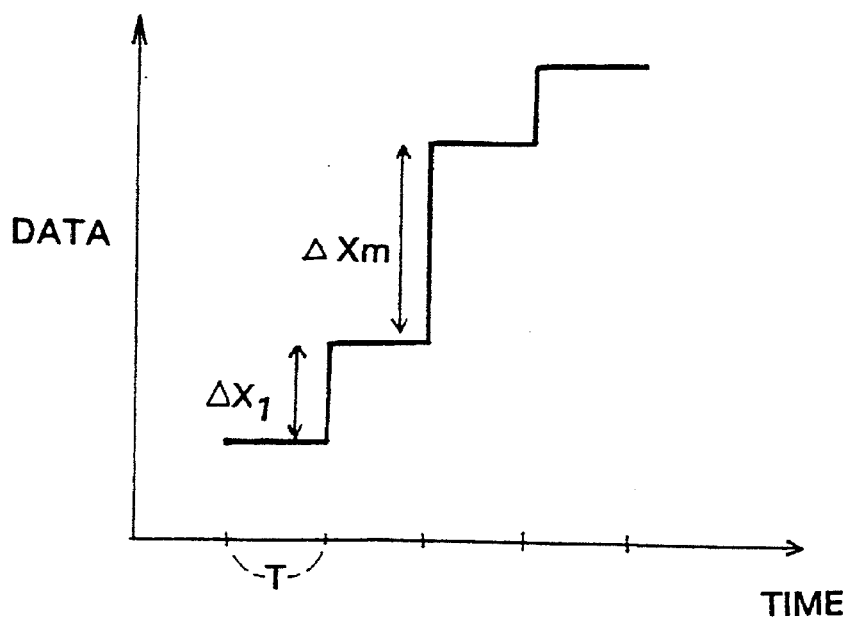

FIGS. 3 (a) and 3 (b) show the above-mentioned variant data restriction. In FIG. 3 (a), the input variant data $\Delta X_1$, $\Delta X_2$ and $\Delta X_3$ are shown and the variant data $\Delta X_2$ are more than the maximum variant data $\Delta X_m$. Therefore, the variant data $\Delta X_2$ are replaced with the maximum variant data $\Delta X_m$ and the resultant data shown in FIG. 3 (b) are delivered from the adder 15 to the DDS 4.

As described above, according to the present invention, even when a data error or abnormal data transition occurs through data transmission for a direct digital synthesizer, undesirable frequency spectrum spread can be prevented from occurring in a resultant FM modulated signal.

What is claimed is:

1. A digital FM modulating apparatus, comprising:

restricting means for receiving input data and restricting the input data to a data range between a lower limit data value and an upper limit data value, said upper limit data value and said lower limit data value respectively corresponding to a maximum allowable frequency and a minimum allowable frequency of an FM modulated signal to be produced, said restricting means comprising an input data comparator for comparing said input data with said lower limit data value and said upper limit data value add a compensator for replacing said input data with said lower limit data value when said input data is below said lower limit data value and for replacing said input data with said upper limit data value when said input data is above said upper limit data value;

suppressing means for receiving output data from said restricting means, suppressing transitional variance in said output data of said restricting means and outputting modulation data;

a direct digital synthesizer for receiving said modulation data delivered from said suppressing means and producing synthesized data corresponding to said FM modulated signal; and said suppressing means comprising a delay having an input and an output, said delay receiving said modulation data at the input thereof, a subtractor for receiving output data from said restricting means and connected to the output of said delay for producing variant data representing the difference between said restricting means output data and said modulation data delivered to said delay and a variant data comparator for receiving said variant data from said subtractor and comparing said variant data with a maximum allowable variant data value to prevent an abnormal transition of data to said direct signal synthesizer.

2. A digital FM modulating apparatus as claimed in claim 1, wherein said variant data comparator outputs variant data received from said subtracter when said variant data is less than said maximum allowable variant data value and outputs said maximum allowable variant data value when said variant data is greater than said maximum allowable variant data value.

3. A digital FM modulating apparatus as claimed in claim 2, further comprising an adder for adding output data received from said variant data comparator and modulation data received from said delay and for providing the results of said adding to said direct digital synthesizer as said modulation data.

4. A digital FM modulating apparatus for producing an FM modulated signal, the apparatus comprising:

a first circuit arrangement for receiving input data and preventing an undesirable spread frequency spectrum from being produced in a modulated signal output by said apparatus, said first circuit arrangement comprising a restricting member for restricting the input data to a data range between a lower limit data value and an upper limit data value, said upper limit data value and said lower limit data value respectively corresponding to a maximum allowable frequency and a minimum allowable frequency of said FM modulated signal;

said restricting member comprising an input data comparator for comparing said input data with said lower limit data value and said upper limit data value and a compensator for replacing said input data with said lower limit data value when said modulation data is below said lower limit data value and for replacing modulation data with said upper limit data value when said input data is above said upper limit data value;

a second circuit arrangement for suppressing transitional variance in the output of said first circuit arrangement and for outputting modulation data;

a direct digital synthesizer for receiving said modulation data output from said second circuit arrangement and producing synthesized data corresponding to said FM modulated signal; and said second circuit arrangement comprising a delay having an input and an output, said input receiving modulation data at the input thereof, a subtractor for receiving output data from said first circuit arrangement and connected to the output of said delay for producing variant data representing the difference between said first circuit arrangement output data and said modulation data delivered to said delay and a variant data comparator for receiving said variant data from said subtractor and comparing said variant data with a maximum allowable variant data value to prevent an abnormal transition of data to said direct digital synthesizer.

5. A digital FM modulating apparatus as claimed in claim 4, wherein said variant data comparator supplies the variant data received from said subtracter to said direct digital synthesizer when said variant data is less than said maximum allowable variant data value and supply said maximum allowable variant data value to said direct digital synthesizer when said variant data is greater than said maximum allowable variant data value.

6. A digital FM modulating apparatus as claimed in claim 5, further comprising an adder for adding output data received from said variant data comparator and modulation data received from said delay and for providing the results of said adding to said direct digital synthesizer as said synthesized data.

* * * * *